United States Patent [19]

Procyk

[11] Patent Number: 4,542,483
[45] Date of Patent: Sep. 17, 1985

[54] DUAL STAGE SENSE AMPLIFIER FOR DYNAMIC RANDOM ACCESS MEMORY

[75] Inventor: Frank J. Procyk, Center Valley, Pa.

[73] Assignee: AT&T Bell Laboratories, Murray Hill, N.J.

[21] Appl. No.: 557,632

[22] Filed: Dec. 2, 1983

[51] Int. Cl.⁴ .......................................... G11C 11/40
[52] U.S. Cl. .................................... 365/190; 365/205; 365/203
[58] Field of Search .............. 365/149, 189, 190, 203, 365/205, 207, 210

[56] References Cited

U.S. PATENT DOCUMENTS

| | | | |
|---|---|---|---|
| 4,069,475 | 1/1978 | Boettcher | 365/205 |
| 4,122,549 | 10/1978 | Kinoshita | 365/222 |
| 4,141,081 | 2/1979 | Horne et al. | 365/203 |
| 4,162,416 | 7/1979 | Beecham et al. | 307/362 |
| 4,247,917 | 1/1981 | Tsang et al. | 365/205 |
| 4,253,163 | 2/1981 | Komoriya et al. | 365/205 |
| 4,255,679 | 3/1981 | White, Jr. et al. | 307/355 |
| 4,274,013 | 6/1981 | Clemons et al. | 307/530 |
| 4,286,178 | 8/1981 | Rao et al. | 307/355 |
| 4,291,392 | 9/1981 | Proebsting | 365/203 |
| 4,370,737 | 1/1983 | Chan | 365/203 |

OTHER PUBLICATIONS

"High Performance Sense Amplifier Circuit", *IBM Tech. Discl. Bull.*, vol. 21, No. 2, S. E. Schuster, Jul. 1978.
"A High Performance Sense Amplifier . . . ", *IEEE Journal of Solid-State Circuits*, vol. SC-15, No. 5, J. J. Barnes et al., Oct. 1980.
"A 100ns 64K Dynamic RAM . . . ", 1981 IEEE International Solid-State Circuits Conference, S. S. Eaton et al., Feb. 1981.
"A New Sense Amplifier . . . ", International Electron Devices Meeting, 1981, T. Furuyama et al., Dec. 1981.
"On the Design of MOS Dynamic . . . ", *IEEE Trans. on Circuits and Systems*, vol. CAS-29, No. 7, N. N. Wang, Jul. 1982.
"An 8K×8 Dynamic RAM . . . ", *IEEE Journal of Solid-State Circuits*, vol. SC-17, No. 5, R. I. Kung et al., Oct. 1982.

*Primary Examiner*—Joseph A. Popek
*Attorney, Agent, or Firm*—Wendy W. Koba

[57] ABSTRACT

The present invention relates to the inclusion of an additional sense amplifier (100) on each column of a dynamic random access memory (RAM). The second sense amplifier is located near the input/output (DQ) line and functions to increase the rate of discharge of the selected column pair ($C_n$, $\overline{C}_n$) thereby improving the transfer of logic information from a selected memory cell (M) to the input/output line associated therewith. The second sense amplifier in the column of the selected memory cell is activated by the same pulse (CCDQ) which connects the selected column to the input/output line, where only the second sense amplifier associated with the accessed column is activated during a single read/write cycle.

8 Claims, 2 Drawing Figures

DUAL STAGE SENSE AMPLIFIER FOR DYNAMIC RANDOM ACCESS MEMORY

BACKGROUND OF THE INVENTION

1. Field of the Invention

The present invention relates to a sense amplifier arrangement for semiconductor memories, including random access memories (RAMs), and read only memories (ROMs), among others, which utilize intersecting rows and columns for access to individual memory cells.

2. Description of the Prior Art

Generally, in a dynamic RAM utilizing a one transistor per cell system, the voltage changes occurring in the data lines are minute and, therefore, a "sense amplifier circuit" (output detector) is necessary for the evaluation and regeneration of data, where the sense amplifier circuit is capable of detecting the read-out data with satisfactory sensitivity and amplifying this data reliably.

In a typical sense amplifier arrangement, a distable sensing amplifier is employed for sensing the voltage difference between the potential on the two conductors of the bit line. Each column conductor may also be referred to as half of the bit line. In the case of a dynamic RAM, this difference results from a sharing of the charge read from a reference cell onto one half of the bit line and from an accessed storage cell on the other half of the bit line. To refresh the electrical signals read out of the memory cells, switchable circuitry is included which is responsive to a timing signal generated after the sense amplifier has latched into a stable state.

One particular prior art dynamic RAM arrangement, disclosed in U.S. Pat. No. 4,069,475 issued to C. E. Boettcher on Jan. 17, 1978, eliminates the need for separate restore timing signals by deriving such signals from a bistable sensing amplifier when the bistable sensing amplifier has switched sufficiently to exceed the turn-on threshold of the corresponding restore bypass switch. Such an arrangement also permits a reduction in the power dissipation of the sense amplifier.

An alternative arrangement is disclosed in U.S. Pat. No. 4,286,178 issued to G. R. Mohan Rao et al on Aug. 25, 1981. Like the above-described Boettcher arrangement, the Rao et al sense amplifier circuit employs a bistble sense amplifier circuit at the center of each column. However, instead of a single pair of cross-coupled driver transistors forming the bistable circuit, dual parallel pairs are used in the Rao et al arrangement. One pair used in the initial sensing has a long channel length so that the pair may be more readily matched, while the other pair, used later in the cycle for driving the zero-going side of the column line to ground, has a shorter channel to enhance speed.

As memory devices require higher packing density, higher speed, and lower power dissipation, the sense amplifiers become more critical. Some prior circuits exhibit high power dissipation and overly long charging and discharging times for the digit lines, while others require high instantaneous current and critical clock timing. Further, as the number of bits increases, the cell size decreases, the magnitude of the storage capacitor in each cell, of necessity, decreases, and the capacitance of the digit lines increase due to the increase in the number of cells on a digit line. These factors reduce the magnitude of the data signal which exists on a digit line, and the speed with which it can be sensed. Similar considerations apply to ROMs, EPROMs, and other memory devices.

Thus, it would be desirable to provide an improved sense amplifier arrangement for memory configurations utilizing row and column conductors for memory cell access with improved signal transfer speed, without unduly increasing the power dissipation.

SUMMARY OF THE INVENTION

The present invention relates to a sense amplifier arrangement for dynamic random access memories (RAMs) and, more particularly, to a dual stage sense amplifier arrangement for a folded-bit line dynamic RAM configuration wherein each column of the memory arrangement includes a pair of sense amplifiers located at opposite ends of the column and separated by a high impedance interrupt device.

It is an aspect of the present invention to provide a second sense amplifier located at the input/output (DQ) line of each column which is activated when the associated column or pair of columns are accessed to increase the signal transfer rate between the accessed columns and the input/output lines.

Another aspect of the present invention is to provide quick reset of accessed memory cells, due to the presence of the second sense amplifier. Additionally, the presence of the second sense amplifier may allow for a reduction in the size of the first amplifier associated therewith.

A further aspect of the present invention is to activate only the second sense amplifier associated with the accessed column, and not the entire set of second sense amplifiers, to reduce the peak current associated therewith.

Other and further aspects of the present invention will become apparent during the course of the following discussion and by reference to the accompanying drawings.

BRIEF DESCRIPTION OF THE DRAWINGS

Referring to the drawings.

DETAILED DESCRIPTION

Figure 1:
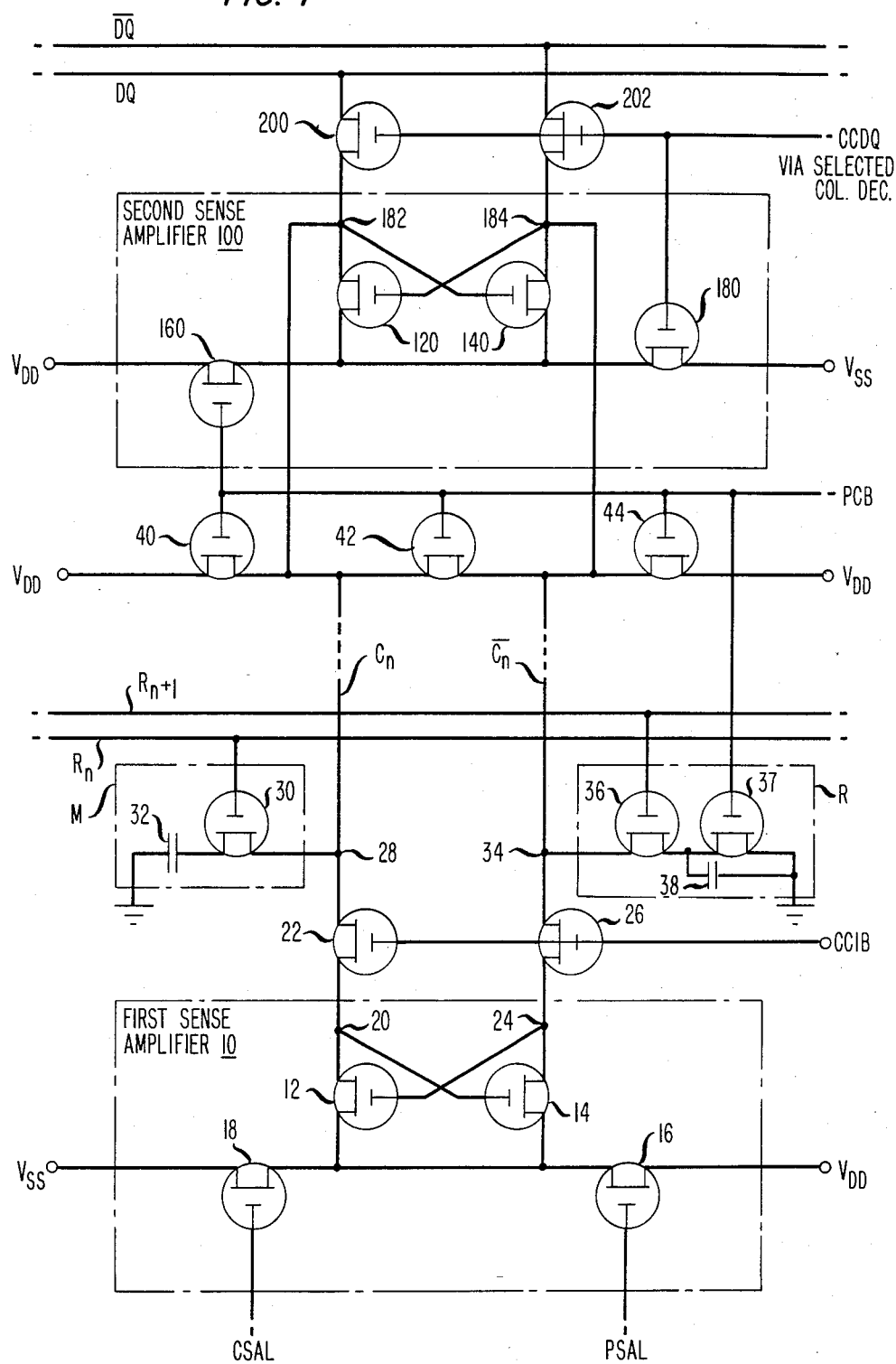
FIG. 1 illustrates an exemplary column of a random access memory device formed in accordance with the present invention.

In many large dynamic RAM arrangements, for example, a 256K dynamic RAM, a folded-bit architecture may be employed to increase the density of the memory arrangement without increasing its physical size. A pair of columns, $C_n$ and $\overline{C}_n$, of a folded-bit line arrangement which illustrate the arrangement of the present invention are shown in FIG. 1. Data is stored in various ones of the memory cells included therein by activating the appropriate $R_n$ line related thereto, and is accessed via I/O lines, denoted DQ and $\overline{DQ}$ in FIG. 1. For illustrative purposes, all transistors illustrated in FIG. 1 are assumed to be n-channel MOS transistors. An MOS transistor will be described as enabled if the potential of the gate is of sufficient amplitude and polarity with respect to the source to allow conduction between the source and the drain of the MOS transistor. Conversely, a disabled MOS transistor is one in which the potential of the gate is insufficient or of the wrong polarity to allow conduction between the source and drain.

Referring now to FIG. 1, an exemplary bit line is illustrated which includes a first sense amplifier 10 disposed at the end of the bit line which is "folded", and a second sense amplifier 100 disposed opposite thereof, near the DQ I/O line. As shown, first sense amplifier 10 includes transistors 12, 14, 16 and 18. Connected to one side of first sense amplifier 10 at a first outer terminal 20 is the source input of a column interrupt transistor 22. Similarly, the source input of a column interrupt transistor 26 is connected to first sense amplifier 10 at a second outer terminal 24. The gate inputs of column interrupt transistors 22 and 26 are both coupled to a CCIB source (not shown) which, depending on level, controls the impedance of transistors 22 and 26 and the degree of coupling from first sense amplifier 10 to the bit line. The drain terminal of column interrupt transistor 22 is connected at a first terminal 28 to a switched capacitor memory cell (illustrated within the dashed rectangle M) which comprises a transistor 30 and a capacitor 32. Connected to the drain input of column interrupt transistor 26 at a second terminal 34 is a reference memory cell (illustrated within the dashed rectangle R) which comprises a pair of transistors 36 and 37 and a capacitor 38 where the value of capacitor 38 is equal to one-half the value of capacitor 32 of memory cell M. As shown in FIG. 1, the source of transistor 37 is coupled to VSS and the drain of transistor 37 is coupled to capacitor 38. Transistor 37 is utilized in this arrangement to initialize capacitor 38 to the VSS reference potential. This arrangement of memory cell M and reference cell R is exemplary only and there exists many other devices capable of functioning as a memory cell in accordance with the present invention.

First sense amplifier 10 senses the logic information stored in memory cell M, as well as that stored in reference cell R, and provides the necessary refresh to allow the memory device to continue to store the correct information. As mentioned hereinbefore, first sense amplifier 10 comprises transistors 12, 14, 16 and 18, which are disposed to function as a latching-type flip-flop. In particular, transistors 12 and 14 comprise a cross-coupled arrangement where the drain of transistor 14 is coupled to the gate of transistor 12 and the drain of transistor 12 is coupled to the gate of transistor 14. The source inputs of transistors 12 and 14 are tied together and applied as the source input to transistor 16 and the drain input to transistor 18. The drain terminal of transistor 16 is connected to the positive voltage source of the memory device, here designated VDD, and the gate input of transistor 16 is connected to a precharge sense amplifier latch (PSAL) source (not shown), where one exemplary PSAL source is described and illustrated in U.S. Pat. No. 4,274,013 issued to D. G. Clemons et al on June 16, 1981. Transistor 16, when activated by a PSAL signal at its gate input, functions to initialize the equalization of the potential appearing at the source of transistors 12 and 14 of first sense amplifier 10 during the precharging of the remainder of the bit line. Each bit line $C_n$ and $\overline{C}_n$ is charged to VDD via a precharge pulse PCB applied to the gate inputs of a trio of boosting precharge transistors 40, 42 and 44, where the drain inputs of transistors 40 and 44 are coupled to VDD and transistor 42 is interposed between column $C_n$ and $\overline{C}_n$. Prior to selection of the desired row conductor $R_n$, the column conductor $C_n$ related thereto will be released from the precharge potential.

During the readout of logic information from memory cell M, CCIB is at a high voltage level and both memory cell M and reference cell R are coupled to first sense amplifier 10 via transistors 22 and 26, respectively. A strobe signal CSAL subsequently pulses the gate of transistor 18, where the source of transistor 18 is connected to the voltage source VSS of the memory arrangement. This pulse enables the sense and refresh of memory cell M.

In prior art sense amplifier arrangements, the size of column interrupt transistors 22 and 26 was determined based on the rate column $C_n$ would discharge and the amount of decoupling needed between terminal pair 20 and 24 and terminal pair 28 and 34. As the size of the memory increases, so does the number of cells occupying each column $C_n$, as well as the capacitance present at terminals 28 and 34, thereby significantly increasing the time of discharge of column $C_n$ to VSS. Therefore, if the column discharge rate is slow, the signal transfer to the DQ line is slow, and the time for latching any DQ amplifiers (not shown) must be increased, resulting in significant increase in device access time.

In accordance with the present invention, therefore, a second sense amplifier 100 is included in each column of the memory arrangement and is disposed, as shown in FIG. 1, near the DQ line to improve the transfer of signal from the column $C_n$ to the DQ line, thus reducing the access time associated with prior art arrangements. Second sense amplifier 100, as shown in FIG. 1, comprises transistors 120, 140, 160 and 180. Transistors 120 and 140 form a cross-coupled arrangement, like transistors 12 and 14 of first sense amplifier 10, where the drain of transistor 140 is coupled to the gate of transistors 120 and the drain of transistor 120 is coupled to the gate of transistor 140. The sources of transistors 120 and 140 are tied together and applied to the drain of transistor 180 and to the source of transistor 160. The drain of transistor 160 is connected to the memory supply voltage VDD and the above-gate is activated by the described bit line precharge pulse PCB. Thus, when PCB is pulsed to precharge bit lines $C_n$ and $\overline{C}_n$ the source inputs of transistors 120 and 140 are similarly precharged. It is to be understood that in operation of the present invention, only the second sense amplifier 100 associated with the accessed column will be activated, since a decoded pulse is employed to initiate the operation of second sense amplifier 100.

When a particular column is desired to be accessed, a CCDQ pulse is generated and applied as the gate input to a pair of column connect transistors 200 and 202. Transistors 200 and 202, upon appearance of a CCDQ pulse, are enabled and connect columns $C_n$ and $\overline{C}_n$ I/O lines DQ and $\overline{DQ}$ respectively. In accordance with the present invention, the same CCDQ pulse enables transistor 180 of second sense amplifier 100 by being applied as the gate input thereto. The drain terminal of transistor 180, like the source of transistor 160, is coupled to the sources of both transistors 120 and 140, the source of transistor 180 is connected to a ground potential (VSS), and the drain of transistor 160 is coupled to VDD. Therefore, when CCDQ is pulsed the precharge potential (VDD) present at the source inputs of transistors 120 and 140 will discharge through transistor 180, thereby lowering the potential of the sources of transistors 120 and 140 with respect to both the gates and drains thereof, which had also been precharged by PCB, thereby enabling transistors 120 and 140. Since one-half of the selected column pair is already approaching ground potential, due to a pulse on CSAL, the activation of transistors 120 and 140 of second sense amplifier 100 functions to latch the selected column half to ground potential faster, since both transistors 18 and 180 are functioning to discharge low-going column half, as opposed to only transistor 18, which is employed in prior art arrangements.

In accordance with the present invention, the shape of the CCDQ pulse does not have to be controlled as necessary for prior art arrangements, since at the time CCDQ is triggered, CSAL has already pulsed and the columns have already begun to latch by first sense amplifier 10 and, therefore, more than a one volt differential exists between columns $C_n$ and $\overline{C}_n$.

Figure 2:
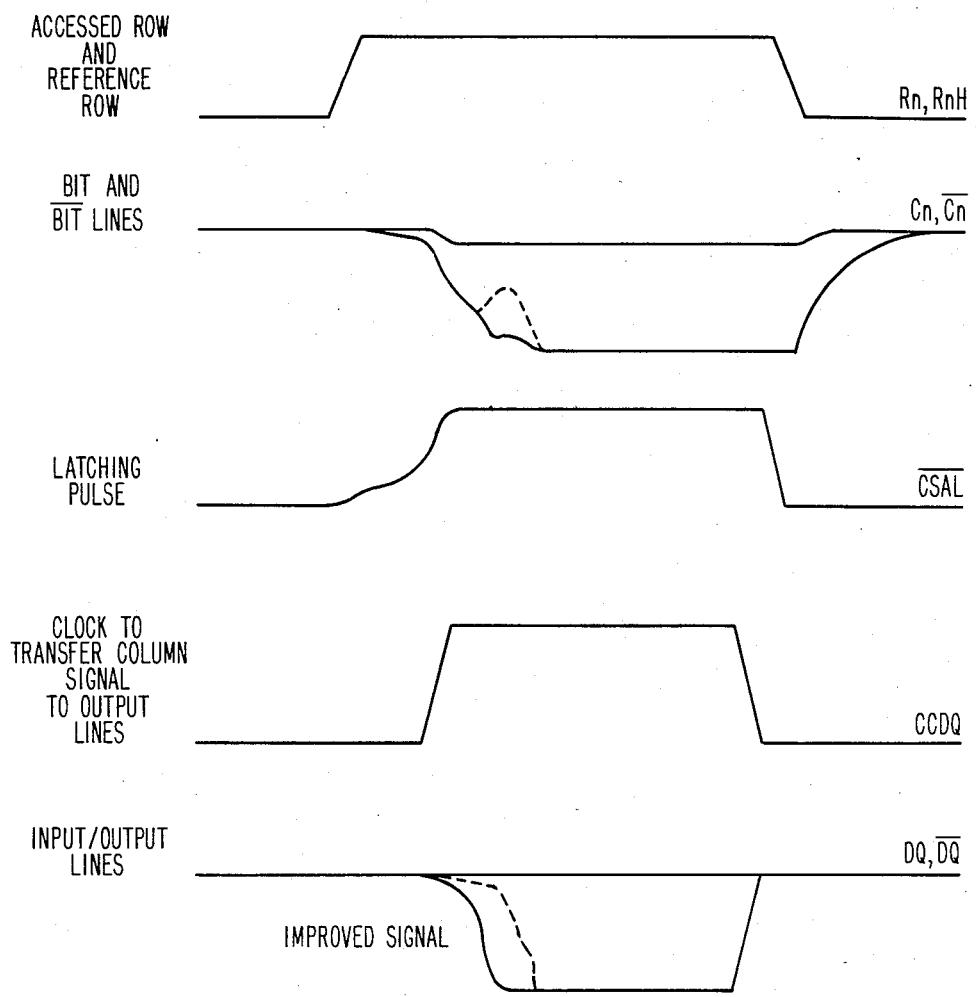
FIG. 2 illustrates a timing diagram depicting various input and output signals related to the operation of the present invention.

A timing diagram depicting the sequence of events associated with the operation of the present invention is illustrated in FIG. 2. Initially, to read the data stored in memory cell M, a pulse is applied along the $R_n$ input line to enable transistor 30. If, for example, capacitor 32 is coupled to VSS, indicating the presence of a "0", the pulse on $R_n$ will allow the charge on the precharged bit line $C_n$ to flow through transistor 30 and be stored on capacitor 32, thereby decrementing the voltage on bit line $C_n$ by an amount equal to the charge transfer, as illustrated by point A of FIG. 2. The voltage on bit line $\overline{C}_n$ will also be decremented by a charge transfer of one-half of the amount on bit line $C_n$ through transistor 36. The voltage difference is sensed by pulsing sense amplifier 10. Sensing and refresh of memory cell M initiated by pulsing, as shown in FIG. 2, the CSAL input to the gate of transistor 18, thereby latching transistors 12 and 14. Thereafter, the CCDQ input is pulsed, thereby connecting columns $C_n$ and $\overline{C}_n$ to the DQ and $\overline{DQ}$ lines, allowing for the transfer of the signal present at terminals 28 and 34 to the DQ and $\overline{DQ}$ lines, respectively. In accordance with the present invention, CCDQ also pulses transistor 180, latching transistors 120 and 140, thereby accelerating the discharge of column $C_n$ by allowing the charge to flow through transistor 180. Therefore, the output signal along DQ, as shown in FIG. 2, falls off significantly faster in accordance with the present invention than is possible in prior art arrangements, thereby significantly increasing the access rate to memory devices formed in accordance with the present invention.

What is claimed is:

1. A random access memory device comprising
   an array of memory cells arranged in a plurality of rows and a plurality of columns, each memory cell comprising an information storage device, a row access port and a column access port;
   a plurality of row access lines, each row access line coupled to the row access ports of a separate row of memory cells, for selecting a row of memory cells to be accessed by applying a row access signal to one row access line of said plurality of row access lines;
   a plurality of column access line pairs, each pair of column access lines coupled to the column access ports of a separate column of memory cells, means for selecting a column of memory cells to be accessed, wherein the intersection of an accessed row and an accessed column pair define a selected memory cell;
   a plurality of input/output lines disposed at one end of the random access memory device, each input/output line couplable to a separate one of the column access lines in each pair of column access lines, for either one of inputing logical information to and outputting logical information from, the selected memory cell;
   a first plurality of sense amplifiers, each sense amplifier associated with a separate one of the pair of column access lines, located opposite to the plurality of input/output lines for sensing the logical information stored in the selected memory cell and restoring said logical information in said selected memory cell subsequent to being accessed; and
   a second plurality of sense amplifiers, each sense amplifier associated with a separate one of the pair column access lines, located adjacent to the plurality of input/output lines for sensing the presence of a column access signal and either one of quickly transferring the logic information stored in the selected memory cell to the input/output line and quickly transferring input logic information from the input/output line to the selected memory cell.

2. A random access memory device formed in accordance with claim 1 wherein each memory cell comprises an MOS transistor and a capacitor, the gate of the MOS transistor coupled to the associated row access line via the row access port associated therewith, the source of said MOS transistor coupled to the associated column access line pair via the column access port associated therewith, and the drain of said MOS transistor connected to the capacitor, wherein the capacitor functions to store, related to the voltage potential thereof, the logic information of the associated memory cell.

3. A random access memory device formed in accordance with claims 1 or 2 wherein
   each sense amplifier of the first plurality of sense amplifiers comprises a pair of cross-coupled switching devices having as separate inputs a column access linepair and latching means responsive to the row access signal for sensing the information stored in the selected memory cell and activating the pair of cross-coupled switching devices to restore the logic information to the capacitor of said selected memory cell subsequent to being activated and transferred to the associated input/output line.

4. A random access memory device formed in accordance with claim 3 wherein each cross-coupled switching device of the first plurality of sense amplifiers comprises a pair of MOS transistors wherein the drain input of a first MOS transistor is coupled to the gate input of a second MOS transistor, the drain of the second MOS transistor is coupled to the gate input of the first MOS transistor, and the source inputs of said first and second MOS transistors are coupled together and connected to the latching means associated therewith.

5. A random access memory device formed in accordance with claim 3 wherein each latching means of the first plurality of sense amplifiers comprises a pair of MOS transistors wherein the source of a first transistor is connected to the cross-coupled switching device associated therewith, the gate is coupled to a latching pulse means and the drain is coupled to a first voltage supply of the memory device, and the drain of a second transistor is coupled to said source of the first transistor, the gate of said second transistor is coupled to a sense amplifier charging pulse means, and the source of said second transistor is coupled to a second voltage supply of said memory device.

6. A random access memory device formed in accordance with claims 1 or 2 wherein each sense amplifier of the second plurality of sense amplifiers comprises a pair of cross-coupled switching devices having as separate inputs a column access line pair and latching means responsive to both the row access signal and the column access signal for sensing the information stored in the selected memory cell and activating the pair of cross-coupled switching devices to quickly transfer the logic information to the input/output line associated therewith.

7. A random access memory device formed in accordance with claim 6 wherein each cross-coupled switching device of the second plurality of sense amplifiers comprises a pair of MOS transistors wherein the drain input of a first MOS transistor is coupled to the gate input of a second MOS transistor, the drain input of the second MOS transistor is coupled to the gate input of the first MOS transistor, and the source inputs of said first and second MOS transistors are coupled together and connected to the latching means associated therewith.

8. A random access memory device formed in accordance with claim 6 wherein each latching means of the second plurality of sense amplifiers comprises a pair of MOS transistors wherein the source of a first transistor is connected to the cross-coupled switching device associated therewith, the gate is coupled to a column precharge means and the drain is coupled to a first voltage supply of the memory device, and the drain of a second transistor, the gate of said second transistor is coupled to a column select means, and the source of said second transistor is coupled to a second voltage supply of said memory device.

* * * * *